United States Patent
Franosch et al.

(10) Patent No.: US 7,612,430 B2
(45) Date of Patent: Nov. 3, 2009

(54) SILICON BIPOLAR TRANSISTOR, CIRCUIT ARRANGEMENT AND METHOD FOR PRODUCING A SILICON BIPOLAR TRANSISTOR

(75) Inventors: Martin Franosch, München (DE); Thomas Meister, Taufkirchen (DE); Herbert Schäfer, Höhenkirchen-Siegertsb (DE); Reinhard Stengl, Stadtbergen (DE); Konrad Wolf, Zweibrücken (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/297,421

(22) PCT Filed: Jun. 15, 2001

(86) PCT No.: PCT/DE01/02226

§ 371 (c)(1), (2), (4) Date: May 6, 2003

(87) PCT Pub. No.: WO01/97273

PCT Pub. Date: Dec. 20, 2001

(65) Prior Publication Data

US 2003/0178700 A1 Sep. 25, 2003

(30) Foreign Application Priority Data

Jun. 14, 2000 (DE) .................. 100 29 270

(51) Int. Cl.
*H01L 29/732* (2006.01)
(52) U.S. Cl. .............. 257/592; 257/E27.053; 257/E27.055
(58) Field of Classification Search .......... 257/592, 257/593, 565, 558, 557, 197, 198, 616, E27.053, 257/E27.055; 438/350
See application file for complete search history.

(56) References Cited

U.S. PATENT DOCUMENTS

| | | | |
|---|---|---|---|
| 4,593,305 A | 6/1986 | Kurata et al. | |
| 4,750,025 A | 6/1988 | Chen et al. | |
| 5,132,764 A | 7/1992 | Bayraktaroglu | |
| 5,177,583 A * | 1/1993 | Endo et al. | 257/190 |
| 5,189,504 A | 2/1993 | Nakayama et al. | |
| 5,302,841 A | 4/1994 | Yamazaki | |
| 5,323,032 A | 6/1994 | Sato et al. | |
| 5,326,718 A | 7/1994 | Klose et al. | |
| 5,352,912 A * | 10/1994 | Crabbe et al. | 257/198 |
| 5,386,140 A * | 1/1995 | Matthews | 257/592 |
| 5,480,816 A * | 1/1996 | Uga et al. | 438/309 |
| 5,569,611 A * | 10/1996 | Imai | 438/350 |
| 5,719,432 A | 2/1998 | Kariyazono et al. | |

(Continued)

FOREIGN PATENT DOCUMENTS

DE AS 1 089 073 9/1960

(Continued)

OTHER PUBLICATIONS

B. Heinemann et al., Influence of low doped emitter and collector regions on high-frequency performance of SiGe-Base HBTs, Solid State Electronics, vol. 30, No. 6, pp. 1183-1189 1995.

(Continued)

*Primary Examiner*—Allan R. Wilson
(74) *Attorney, Agent, or Firm*—Altera Law Group, LLC

(57) ABSTRACT

The silicon bipolar transistor (100) comprises a base, with a first highly-doped base layer (105) and a second poorly-doped base layer (106) which together form the base. The emitter is completely highly-doped and mounted directly on the second base layer (106).

14 Claims, 3 Drawing Sheets

U.S. PATENT DOCUMENTS

| | | | |
|---|---|---|---|
| 5,962,880 A * | 10/1999 | Oda et al. | 257/198 |
| 6,255,674 B1 * | 7/2001 | Luy et al. | 257/198 |
| 6,388,307 B1 * | 5/2002 | Kondo et al. | 257/592 |
| 6,570,241 B2 * | 5/2003 | Hashimoto | 257/592 |
| 6,642,553 B1 * | 11/2003 | Drews et al. | 257/197 |
| 6,974,977 B2 * | 12/2005 | Washio et al. | 257/197 |

FOREIGN PATENT DOCUMENTS

| | | |
|---|---|---|
| DE | OS 151 48 48 | 6/1969 |
| DE | 230 677 A3 | 7/1983 |
| DE | 42 40 205 A1 | 8/1993 |
| DE | 198 45 789 A1 | 3/2000 |
| JP | 03-192 727 | 8/1991 |
| JP | 03-280-546 | 12/1991 |
| JP | 5-35603 | 2/1993 |
| WO | WO 93/08599 | 4/1993 |

OTHER PUBLICATIONS

D> Knoll et al, Si/SiGe:C Heterojunction Bipolar Transistors in an Epi-Free Well, Single-Polysilicon Technology, IEDM 98, pp. 703-706, 1998.

T.F. Meister et al., SiGe Base Bipolar Technology with 74 GHz $F_{nu}$ and 11 ps Gate Delay ,IEDM, pp. 739-742, 1995.

Niu Guofi et al., Noise Parameter Modeling and SiGe Pofile Design Tradeoffs for RF Applications. Proc. Of the $2^{nd}$ Topical Meeting on Silicon Monolithic Integrated Circuits in RF Systems, pp. 9-14, 2000.

Lanzerotti L.D. et al., Suppression of boron out diffusion in sige HBTs by carbon incorporation, New York, IEEE, US, pp. 249-252, Dec. 8, 1966.

* cited by examiner

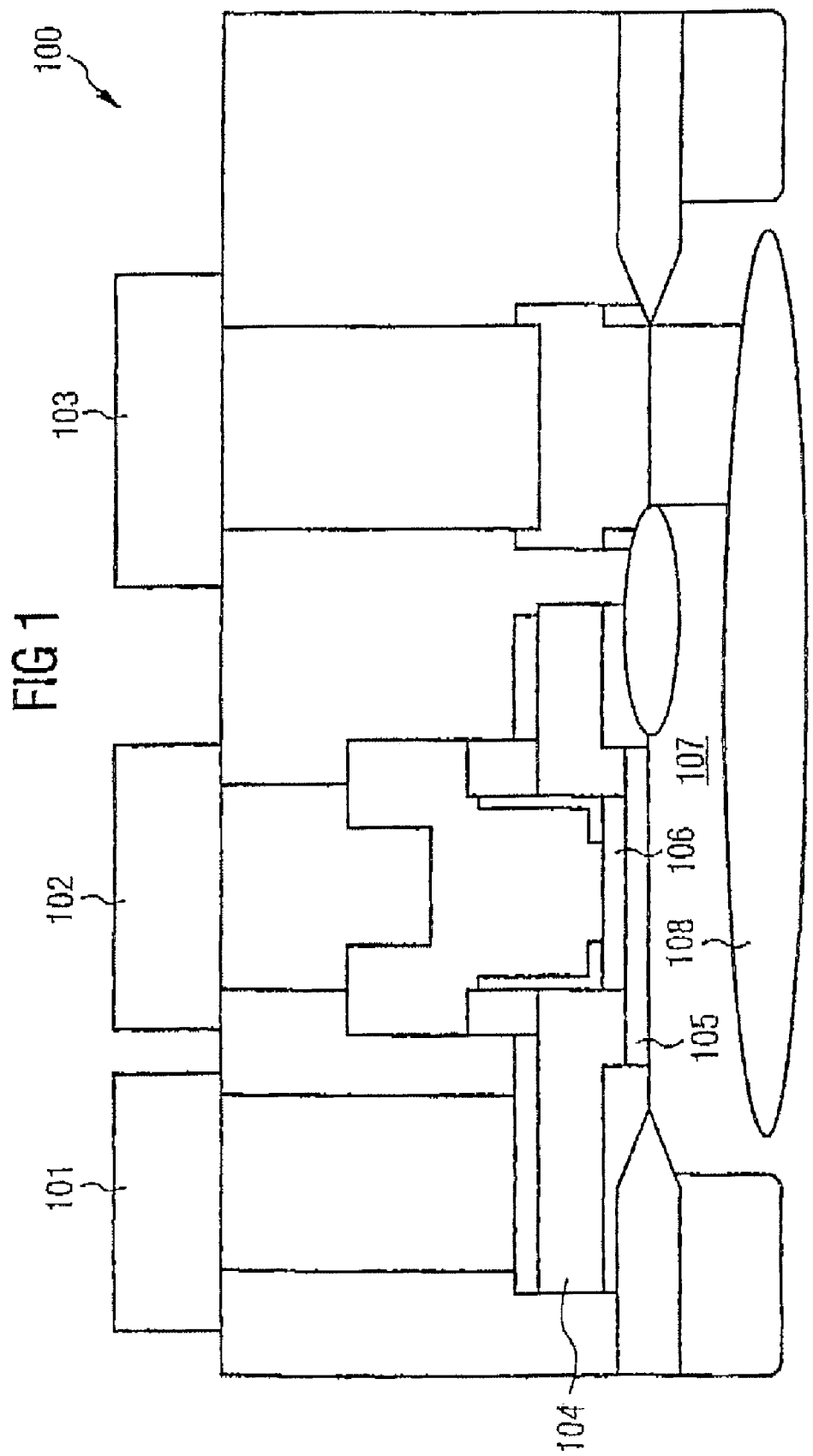

SILICON BIPOLAR TRANSISTOR, CIRCUIT ARRANGEMENT AND METHOD FOR PRODUCING A SILICON BIPOLAR TRANSISTOR

The invention relates to a silicon bipolar transistor, a circuit arrangement and also a method for producing a silicon bipolar transistor.

A silicon bipolar transistor, such a circuit arrangement and such a method of production are known from [1].

A normal silicon bipolar transistor has an emitter, a base and a collector.

In the bipolar transistor known from [1], the maximum oscillating frequency of a bipolar transistor is known to be given in accordance with the following specification:

$$f_{max} \propto \sqrt{\frac{f_T}{6 \cdot \Pi \cdot R_B \cdot C_{BC}}}, \quad (1)$$

where
- $f_{max}$ denotes the maximum oscillating frequency of the bipolar transistor,
- $f_T$ denotes the transit frequency of the bipolar transistor,
- $R_B$ denotes the base resistance of the bipolar transistor,
- $C_{BC}$ denotes the base/collector capacitance of the bipolar transistor.

As can be seen from [1], it is thus desirable to reduce the base resistance $R_B$ of a bipolar transistor in order to obtain the highest possible oscillating frequency for the bipolar transistor.

The base resistance $R_B$ of a bipolar transistor is determined both by the electrical resistance of the connection region and by the sheet resistance of the base doping profile with doping atoms.

When the transistor base is homogeneously doped with doping atoms, the sheet resistance, which is also called the pinch, is inversely proportional to the layer thickness of the base.

However, increasing the layer thickness of the base of the bipolar transistor results in an increase in the base transit time $\tau$ for the minority carriers in the bipolar transistor.

Increasing the doping of the base with doping atoms beyond a concentration of $5 \times 10^{18}$ cm$^{-3}$ causes a reduction in the breakdown voltage of the junction between the emitter and the base of the bipolar transistor to excessively low values and at the same time increases the base/emitter depletion layer capacitance.

To reduce the base resistance, [1] makes provision for the emitter of the bipolar transistor to be lightly doped with doping atoms in a concentration of approximately $10^{18}$ cm$^{-3}$.

By contrast, the base of the bipolar transistor known from [1] is heavily doped with doping atoms in a doping atom concentration of approximately $10^{20}$ cm$^{-3}$.

The effect achieved by this is that, when the emitter is lightly doped, the base can be heavily doped without losing the blocking ability of the emitter/base junction of the bipolar transistor.

To increase the transit frequency, the base of the transistor described in [1] contains germanium.

In addition, [2] describes reduction of the boron diffusion by adding carbon atoms for a transistor having an epitaxial emitter.

In addition, [3] discloses a bipolar transistor which has a very high maximum oscillating frequency $f_{max}$ of 74 GHz.

[6] describes a bipolar transistor based on gallium arsenide, where a base layer comprising two partial base layers, a p$^{++}$-doped first base layer and a p$^+$-doped second base layer respectively made of gallium arsenide is applied on a collector layer made of n-doped gallium arsenide.

The p$^+$-doped gallium arsenide partial base layer serves as diffusion barrier for the zinc doping atoms. The p$^+$-doped gallium arsenide layer has an n$^+$-doped emitter stop layer applied on it which serves as barrier layer between the emitter and the base for insulating the zinc, the intention being to continue to ensure that the emitter is n-doped. The emitter stop layer has an n-doped "graded" emitter layer sequence made of gallium arsenide applied on it.

In addition, [7] illustrates a silicon bipolar transistor containing a base which has two base layers, a first, p$^+$-doped base layer being applied on an n-doped collector, and a p$^-$-doped second base layer being applied on this base layer. The second base layer has an n-doped, i.e. lightly doped, first intermediate layer applied on it, and only then is the heavily doped n$^+$-emitter applied on said first intermediate layer.

This layer sequence has the particular drawback that an n-doped intermediate layer needs to be inserted between the base and the emitter, which means considerable complexity for production, particularly in mass production, and hence creates considerable technological difficulties. In addition, the production costs in mass production are very high for such a transistor.

[8] describes a power transistor in which the base layer contains a further layer of the same conductivity type as the base layer.

[9] describes a transistor in which the emitter zone has a zone of the base zone's conduction type arranged before it, the defect concentration of said zone being lower than that of the base zone, but amounting to at least $10^{16}$ defects per cm$^3$.

[10] describes a semiconductor apparatus in which an emitter layer, an intrinsic base layer surrounding the emitter layer, with the surface of the emitter layer permitting exposure, external base layers and link base layers situated between the intrinsic base layer and the external base layers are formed on a collector layer.

[11] describes a transistor for switching with a partially falling characteristic and a semiconductor body having the zone sequence npp$^+$n$^+$ or pnn$^+$p$^+$.

[12] describes a bipolar transistor and a method for production thereof, the bipolar transistor having a collector region and insulating regions which surround the latter. Arranged above the collector region is a monocrystalline layer sequence, and arranged above the insulating regions is a polycrystalline layer sequence, a cover layer being arranged above the base layer, and part or all of the cover layer being removed in the active emitter region.

Other GaAs bipolar transistors are described in [13], [14] and [15].

The invention is thus based on the problem of specifying a silicon bipolar transistor, a circuit arrangement and also a method for producing a silicon bipolar transistor where the silicon bipolar transistor has a higher maximum oscillating frequency $f_{max}$ as compared with a silicon bipolar transistor in accordance with [3]. The problem is solved by the silicon bipolar transistor, the circuit arrangement and also by the method for producing a silicon bipolar transistor having the features in accordance with the independent patent claims.

A silicon bipolar transistor has an emitter, a base and a collector. The entire emitter is heavily doped with doping atoms, the doping atoms being of opposite conductivity type to the doping atoms used for doping the base regions. This means that, if the base regions are n-doped, the entire emitter is heavily p-doped, and if the base regions are p-doped, the entire emitter is heavily n-doped. The emitter preferably contains polysilicon.

The base is grouped into a first base region and a second base region, the second base region being doped with doping atoms, for example with boron atoms, in a low concentration, i.e. the second base region is lightly doped with doping atoms.

By contrast, the first base region is heavily doped with the doping atoms, for example with boron atoms.

The terms "light doping" and "heavy doping" should be understood, within the context of this invention, as meaning that the number of doping atoms per $cm^3$ is much greater in the case of heavy doping as compared with light doping, preferably greater by at least a factor of two.

By way of example, the second base region may have a doping of $5 \times 10^{17}$ to $1 \times 10^{19}$ doping atoms per $cm^3$, and the first base region may have a doping of $10^{19}$ to approximately $2 \times 10^{20}$ doping atoms per $cm^3$.

The invention can clearly be seen in that a bipolar transistor's base, which is normally doped as homogeneously as possible, is split into a first region, the first base region, with heavy doping and a second region, the second base region, with light doping.

In this way, the sheet resistance of the base, i.e. the base resistance $R_B$, is significantly reduced, and may even be reduced by more than a factor of 5.

In accordance with one refinement of the invention, the widths of the first base region (first base width W1) and of the second base region (second base width W2) can be proportioned in accordance with the following specifications:

The second base width W2 preferably has a width of 10 nm to 40 nm, which is chosen on the basis of the desired reverse voltage of the emitter/base pn junction, for example a second base width W2 of 20 nm for a reverse voltage of 2V.

The first base width W1 is chosen to be as thin as possible. In addition, the first base region is doped as heavily as possible, so that no severe widening of the profile occurs during subsequent temperature steps. The first base width W1 may be 1 nm to 30 nm, for example.

The first base region is situated at the collector of the bipolar transistor and, as can be seen from the specifications illustrated above, is preferably formed so as to be as narrow as possible, i.e. with as small a first base width W1 as possible, and is doped as heavily as possible with doping atoms.

To reduce the diffusion of the individual doping atoms between the first base region and the second base region further, it is advantageous, in accordance with one refinement of the invention, to supply carbon atoms to the base in order to reduce the diffusion of the, by way of example, boron doping atoms.

In accordance with one refinement of the invention, a transistor current gain possibly decreasing with rising base charge can advantageously be compensated for by adding germanium atoms. In addition, adding Ge further increases the transit frequency of the bipolar transistor, and hence also the maximum oscillation frequency.

In accordance with another refinement of the invention, provision is made for the second base region to be doped with a concentration of approximately $5 \times 10^{18}$ $cm^{-3}$, and for the first base region to be doped with $3 \times 10^{19}$ $cm^{-3}$ doping atoms.

As described in [3], the emitter window (i.e. the region in which the emitter is to be formed) is opened using dry etching in a sandwich structure. Viewed from bottom to top, the sandwich structure contains:

p$^+$-polysilicon,
TEOS,
nitride.

The side wall of the emitter window is produced by a nitride spacer.

The collector, which is initially still covered by an oxide layer, is exposed by means of isotropic wet etching. In this case, a polysilicon overhang is produced by under-etching the polysilicon situated above, as described in [4].

In addition, in accordance with one preferred refinement of the invention, provision is made for aluminium atoms or else gallium atoms to be used as the doping atoms instead of boron atoms.

However, the use of boron atoms has the advantage that the boron atoms normally have a lower diffusion speed than the further known doping atoms, which may of course be used as an alternative, and this is particularly advantageous for producing the two base regions with greatly different doping.

A circuit arrangement having at least one such bipolar transistor is particularly suitable for use in radio-frequency applications, for example in the mobile radio sector or generally in processors with a high clock rate.

In a method for producing a bipolar transistor, after insulation, i.e. after the collector has been formed, a first base layer, which forms the first base region, is grown on the collector, preferably by means of vapour phase epitaxy using a first partial pressure, for example using diborane ($B_2H_6$) as the doping gas.

It should be pointed out that the incorporation of the doping atoms is, to a first approximation, linear to the partial pressure used during the vapour phase epitaxy.

On the first base layer, a second base layer, which forms the second base region, is grown by means of vapour phase epitaxy using a second partial pressure, the second partial pressure being much lower than the first partial pressure, and the use of diborane as the doping gas, likewise within the context of the vapour phase epitaxy for the second base layer, meaning that the second base layer and hence the second base region have a much lighter doping than the first base layer, i.e. the first base region.

In accordance with one refinement of the invention, as the base is formed, germanium is added in accordance with the procedure described in [5], the invention ensuring that the step profile, formed by the first base region and the second base region, is formed appropriately, as subsequently described in connection with FIG. 3. The emitter is applied directly on the second base region. The entire emitter is heavily doped with doping atoms.

Exemplary embodiments of the invention are illustrated in the figures and are explained in more detail below.

FIG. 1 shows a cross-section through a bipolar transistor in accordance with an exemplary embodiment of the invention;

Figure 2A:
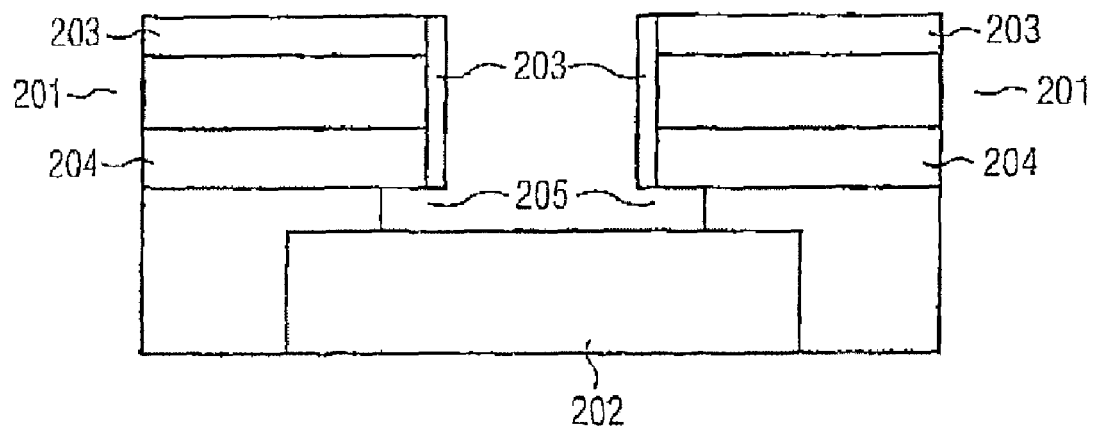
FIGS. 2a to 2c show cross-sections through the structure of the bipolar transistor at different production instants.

FIG. 1 shows a bipolar transistor 100 having a base connection 101, an emitter connection 102 and a collector connection 103.

The base connection 101 is coupled to two base regions forming the base by means of a p-doped polysilicon layer 104.

A first base region 105 has a heavy doping of $3 \times 10^{19}$ doping atoms, of boron atoms in accordance with this exemplary embodiment.

A second base layer 106, as the second base region, is grown on the first base region 105 by means of vapour phase epitaxy, the doping of the second base region 106 being approximately $5 \times 10^{18}$ doping atoms per $cm^3$.

The base, in particular the first base region 105, is grown on a collector layer 107 by means of vapour phase epitaxy, as explained in more detail below. An n+-doped layer 108 is embedded in the collector layer (n+-buried layer).

The n+-doped layer 108 couples the collector 107, i.e. the collector layer 107, to the collector connection 103.

Figure 2B:
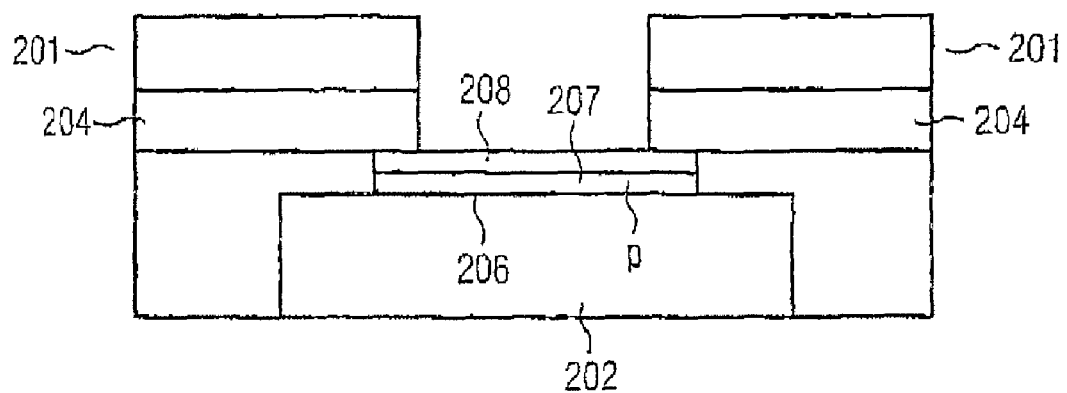
Figure 2C:
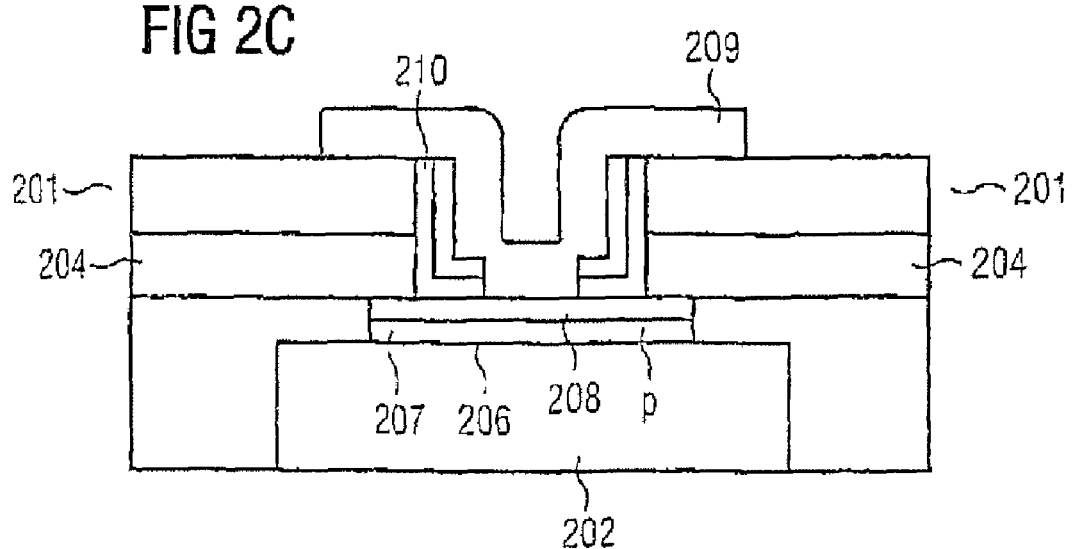

The method described below for producing the bipolar transistor, as shown in FIG. 2a to FIG. 2c, essentially corresponds to the production method as described in [3] for a bipolar transistor with a homogeneously doped base.

However, a difference in the production method is provided within the context of formation of the base layer.

Starting from a collector layer 107 containing silicon, the emitter region, i.e. the region in which the emitter is to be formed at the end of the production method, is defined, as described in [3], by means of a sandwich structure formed on an oxide layer which is formed from the vapour phase using a deposition method (CVD method).

Viewed from bottom to the top, the sandwich structure contains the following layers:

p+-polysilicon,
TEOS,
nitride.

The side wall of the emitter window is produced by a nitride spacer.

The collector, which is initially still covered by an oxide layer, is exposed by means of isotropic wet etching. In this case, a polysilicon overhang is produced by under-etching the polysilicon situated above, as described in [4].

The collector layer 107 is n-doped with $2\times10^{17}$ cm$^{-3}$ doping atoms. After thin nitride spacers 203 have been formed on the sandwich structure 201, the oxide layer 202 is under-etched below the p+-doped polysilicon layer 204 using wet etching, so that contact regions 205 having a width of approximately 0.1 µm are produced.

In a further step (cf. FIG. 2b), vapour phase epitaxy is used at a temperature of 650° C. to 900° C. and a pressure of 1 to 100 torr to grow the base layer 206, formed by the first base layer 207 and the second base layer 208.

In accordance with this exemplary embodiment, the gases used within the context of the vapour phase epitaxy are a hydrogen carrier gas at 10 to 50 slm, containing the following gases for incorporating carbon atoms and germanium atoms in order to obtain the properties of the bipolar transistor and to reduce the diffusion of the doping atoms (described below) between the first base region and the second base region:

dichlorosilane ($SiH_2Cl_2$),
hydrochloric acid (HCl),
germane ($GeH_4$),
methylsilane ($SiH_3CH_3$), which gases are used within the context of the vapour phase epitaxy at a partial pressure of $10^{-4}$-$10^{-2}$ of the total pressure used within the context of the vapour phase epitaxy.

Figure 3:
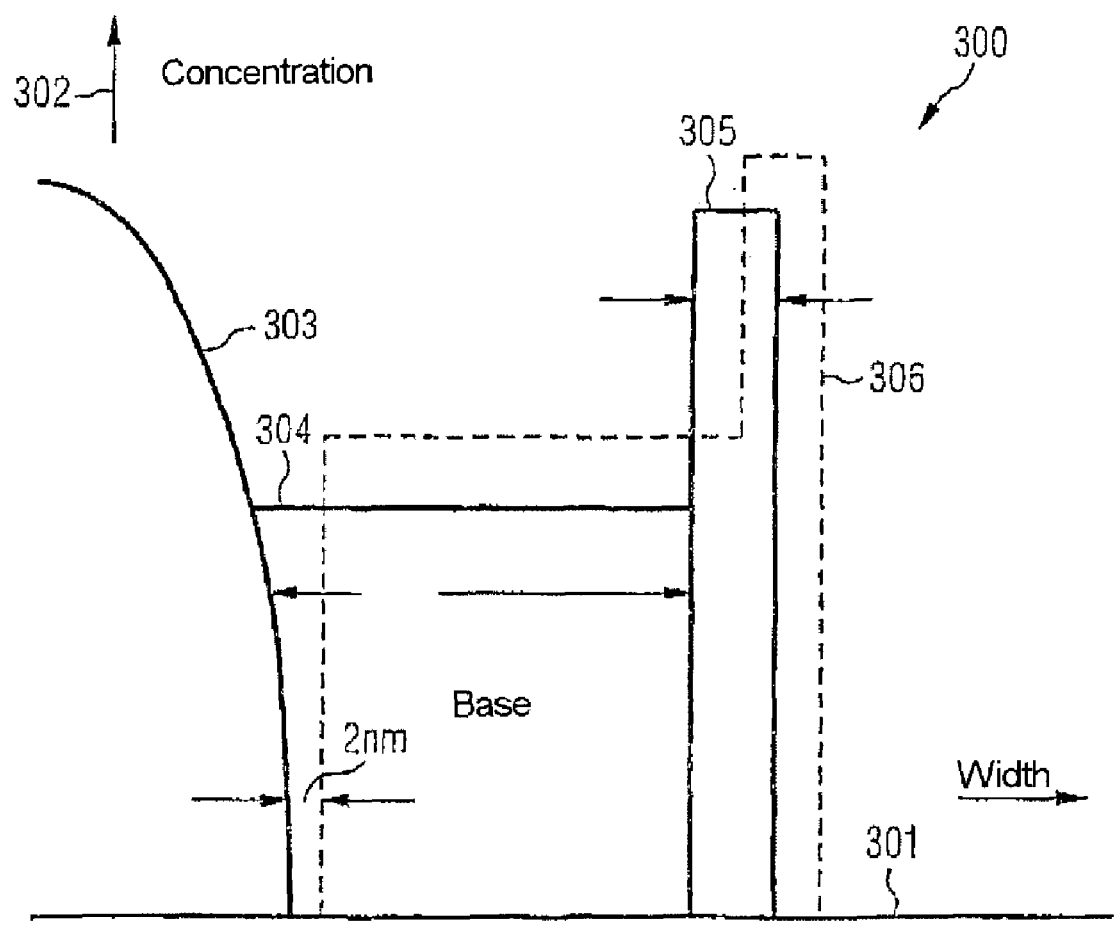
FIG. 3 shows a sketch of the doping profile of the bipolar transistor from FIG. 1.

The doping gas used for forming the first base layer 207 is diborane ($B_2H_6$) at a partial pressure of $10^{-5}$ of the total pressure. In this context, germane is added to the first base layer at a partial pressure of $10^{-4}$, so that the first base layer has a concentration of germanium atoms of approximately 20% with $3\times10^{19}$ boron atoms, so that the doping profile described in [5], for example, is produced for germanium, as shown in FIG. 3.

On account of the dependency of the concentration of the doping being, to a first approximation, linear to the partial pressure, a doping of doping atoms in the first base layer 207 is produced which is greater by at least a factor of 2 than the concentration, i.e. the doping with doping atoms, in the second base layer 208.

The first base width W1 is chosen to be as thin as possible. In addition, the first base region is doped as heavily as possible, so that no severe widening of the profile occurs during subsequent temperature steps. In accordance with this exemplary embodiment, the first base width W1 is 1 nm to 30 nm.

On the first base layer 207, diborane ($B_2H_6$) is used to form the second base layer 208 at a partial pressure of $10^{-6}$ of the total pressure.

In turn, germane is added in accordance with the profile shown in FIG. 3 during formation of the second base layer 208, at a partial pressure of $10^{-5}$ of the total pressure.

This produces the second base layer 208 with a doping concentration of approximately $5\times10^{18}$ boron doping atoms per cm$^3$ and approximately 5% germanium atoms.

In accordance with this exemplary embodiment, the second base width W2 has a width of 10 nm to 40 nm, which is chosen on the basis of the desired reverse voltage of the emitter/base pn junction, and has a second base width W2 of 20 nm for a reverse voltage of 2 V.

In a further step (cf. FIG. 2c), the nitride spacers 203 are removed using phosphoric acid, and, in accordance with the method described in detail in [3], the n+-doped polysilicon emitter 209 is formed on further spacers 210, which are in turn grown on the second base layer 208.

In accordance with this procedure, the doping profile 300 shown in FIG. 3 is produced to form the bipolar transistor 100 from FIG. 1.

Along the ordinate 301, which describes the local orientation against the direction of growth of the individual layers within the bipolar transistor 100, the respective concentration of the doping atoms in the respective layer is shown using the abscissa 302.

It is advantageous to design the first base region to be as narrow as possible and to dope it heavily in order to keep down the transit time of the electrons via the base.

On the basis of an emitter doping curve 303, which shows the doping concentration of the doping atoms in the emitter layer 209, a second base doping profile 304 along the second base width W2 is then used to show the profile of the doping of boron atoms in the second base layer 208 of $5\times10^{18}$ boron atoms per cm$^3$, which second base layer merges in stepped fashion, i.e. essentially abruptly, into a heavy doping in the first base region, i.e. the first base layer 207 with the first base width W1, in which a doping of boron atoms of $3\times10^{19}$ boron atoms per cm$^3$ (symbolized by the first base doping profile 305) is provided.

Dashed lines 306 show the corresponding concentration profile for germanium atoms in the first base layer 207 and second base layer 208 in the base. The plateau region, i.e. the second base region, contains approximately 5% germanium atoms. The collector-side region, i.e. the first base region, contains approximately 20% germanium atoms.

Experiments have shown that such a bipolar transistor having the doping profile shown above halves a sheet resistance for the base of, normally, 7 kΩ to 3.5 kΩ by using the base profile, with the transit time τ of the bipolar transistor of 1.5 ps for a homogeneous base increasing only insignificantly to a transit time of 1.6 ps for a split base with different dopings.

This document cites the following publications:

[1] B. Heinemann et al., Influence of low doped emitter and collector regions on high-frequency performance of SiGe-Base HBTs, Solid State Electronics, Vol. 38, No. 6, pp. 1183-1189, 1995

[2] D. Knoll et al, Si/SiGe:C Heterojunction Bipolar Transistors in an Epi-Free Well, Single-Polysilicon Technology, IEDM 98, pp. 703-706, 1998
[3] T. F. Meister et al., SiGe Base Bipolar Technology with 74 GHz $f_{max}$ and 11 ps Gate Delay, IEDM, pp. 739-740, 1995
[4] U.S. Pat. No. 5,326,718
[5] Niu Guofu et al, Noise Parameter Modeling and SiGe Profile Design Tradeoffs for RF Applications, Proc. Of the 2nd Topical Meeting on Silicon Monolithic Integrated Circuits in RF Systems, pp. 9-14, 2000
[6] U.S. Pat. No. 5,132,764
[7] U.S. Pat. No. 5,177,583
[8] DD 230 677 A3
[9] DE-OS 151 48 48
[10] DE 42 40 205 A1
[11] DE-AS 1 089 073
[12] DE 198 45 789 A1
[13] U.S. Pat. No. 4,593,305
[14] JP 03-280 546
[15] JP 03-192 727

The invention claimed is:

1. A silicon bipolar transistor, having:
a base;
an emitter, the entirety of which is heavily doped with doping atoms; and
a collector,
where the base has a first base region having a first base width and a second base region having a second base width, the first base width being thinner than the second base width, wherein the base contains germanium atoms,
where the first base region is doped with $10^{19}$ to $2\times10^{20}$ cm$^{-3}$ doping atoms to reduce the sheet resistance of the base compared to the sheet resistance of a base having a lower average doping concentration than an average doping concentration of the first and the second base region,
where the second base region is doped with $5\times10^{17}$ to $1\times10^{19}$ cm$^{-3}$ doping atoms, merging in stepped fashion into the first base region,
where the emitter is applied directly on the second base region, and
where at least a part of the first base region at least partly has a higher concentration of germanium atoms than at least a part of the second base region.

2. Silicon bipolar transistor according to claim 1, in which the first base region is arranged closer to the collector than the second base region.

3. Silicon bipolar transistor according to claim 1, in which the first base region is more heavily doped with doping atoms than the second base region by at least a factor of 2.

4. Silicon bipolar transistor according to claim 3, in which the second base region has a doping of approximately $5\times10^{18}$ doping atoms per cm$^3$.

5. Silicon bipolar transistor according to claim 3 or 4, in which the first base region has a doping of approximately $3\times10^{19}$ doping atoms per cm$^3$.

6. Silicon bipolar transistor according to claim 1, in which the second base width is between 10 nm and 40 nm.

7. Silicon bipolar transistor according to claim 1, in which the first base width is between 1 nm and 30 nm.

8. Silicon bipolar transistor according to claim 1, in which the doping atoms contain boron atoms.

9. Silicon bipolar transistor according to claim 1, in which the base contains further carbon atoms for reducing the diffusion of the doping atoms.

10. Silicon bipolar transistor according to claim 1, in which the emitter contains polysilicon.

11. Circuit arrangement having at least one silicon bipolar transistor according to claim 1.

12. The silicon bipolar transistor according to claim 1, wherein the second base region contains approximately 5% germanium atoms and the first base region contains approximately 20% germanium atoms.

13. The silicon bipolar transistor according to claim 1, wherein the concentration of germanium atoms in the first base region and the concentration of germanium in the second base region merge in stepped fashion.

14. Method for producing a silicon bipolar transistor, the method comprising:
forming a collector;
forming a base;
doping a first base region with $10^{19}$ to $2\times10^{20}$ cm$^{-3}$ doping atoms to reduce the sheet resistance of the base compared to the sheet resistance of a base having a lower average doping concentration than an average doping concentration of the first and the second base region;
doping a second base region, wherein the first base width is thinner than the second base width, with $5\times10^{17}$ to $1\times10^{19}$ cm$^{-3}$ doping atoms; merging in stepped fashion into the heavily doped first region;
introducing germanium atoms into the base such that at least a part of the first base region has a higher concentration of germanium atoms than at least part of the second base region;
forming an emitter directly on the second base region; and
heavily doping the entire emitter with doping atoms.

* * * * *